United States Patent
Kwon et al.

(10) Patent No.: US 9,482,943 B2
(45) Date of Patent: Nov. 1, 2016

(54) POSITIVE PHOTOSENSITIVE RESIN COMPOSITION, AND PHOTOSENSITIVE RESIN FILM AND DISPLAY DEVICE PREPARED BY USING THE SAME

(71) Applicant: Cheil Industries Inc., Gumi-si (KR)

(72) Inventors: Ji-Yun Kwon, Uiwang-si (KR);
Jin-Hee Kang, Uiwang-si (KR);
Dae-Yun Kim, Uiwang-si (KR);
Sang-Kyeon Kim, Uiwang-si (KR);
Sang-Soo Kim, Uiwang-si (KR);
Yong-Tae Kim, Uiwang-si (KR);
Kun-Bae Noh, Uiwang-si (KR);
Eun-Bi Park, Uiwang-si (KR);
Jae-Yeol Baek, Uiwang-si (KR);
Jae-Hwan Song, Uiwang-si (KR);
Eun-Kyoung Youn, Uiwang-si (KR);
Bum-Jin Lee, Uiwang-si (KR);
Jong-Hwa Lee, Uiwang-si (KR);
Jin-Young Lee, Uiwang-si (KR);
Chung-Beum Hong, Uiwang-si (KR);
Eun-Ha Hwang, Uiwang-si (KR);
In-Chul Hwang, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/283,342

(22) Filed: May 21, 2014

(65) Prior Publication Data
US 2015/0050594 A1    Feb. 19, 2015

(30) Foreign Application Priority Data
Aug. 13, 2013    (KR) ........................ 10-2013-0096165

(51) Int. Cl.
*G03F 7/023* (2006.01)
*G03F 7/022* (2006.01)
*G03F 7/004* (2006.01)
*G03F 7/075* (2006.01)

(52) U.S. Cl.
CPC ........... *G03F 7/0226* (2013.01); *G03F 7/0045* (2013.01); *G03F 7/0233* (2013.01); *G03F 7/0755* (2013.01)

(58) Field of Classification Search
CPC ........................... G03F 7/0226; G03F 7/0233
USPC .................................. 430/18, 191, 192, 193
See application file for complete search history.

(56) References Cited

U.S. PATENT DOCUMENTS

| | | |
|---|---|---|
| 2,772,975 A | 12/1956 | Rickers |
| 2,797,213 A | 6/1957 | Moore |
| 3,669,658 A | 6/1972 | Yonezawa et al. |
| 6,232,032 B1 * | 5/2001 | Nunomura ............ G03F 7/0233 430/191 |
| 8,097,386 B2 * | 1/2012 | Nakano et al. .................. 430/18 |
| 8,198,002 B2 | 6/2012 | Jung et al. |
| 8,815,489 B2 | 8/2014 | Jeong et al. |
| 9,176,381 B2 | 11/2015 | Lee et al. |
| 2003/0022093 A1 * | 1/2003 | Takahashi ..................... 430/146 |
| 2003/0134223 A1 * | 7/2003 | Katano ................... G03F 7/022 430/191 |
| 2013/0012618 A1 * | 1/2013 | Hiro et al. ..................... 523/400 |
| 2013/0022908 A1 | 1/2013 | Shiozaki et al. |

FOREIGN PATENT DOCUMENTS

| | | |
|---|---|---|
| JP | 06-060140 A | 8/1994 |
| JP | 09-302221 A | 11/1997 |
| JP | 10-307393 A | 11/1998 |
| JP | 2000-075489 A | 3/2000 |
| JP | 2000-292913 A | 10/2000 |
| JP | 2003-337431 A | 11/2003 |
| KR | 10-2005-0007302 A | 1/2005 |
| KR | 10-0940469 | 2/2010 |
| KR | 10-2010-0044125 A | 4/2010 |
| KR | 10-2010-0080260 A | 7/2010 |
| KR | 10-2010-0080343 A | 7/2010 |
| KR | 10-2011-0075691 A | 7/2011 |
| KR | 10-1247622 A | 3/2013 |
| KR | 10-2013-0060034 A | 6/2013 |
| KR | 10-2010-0077669 A | 9/2013 |
| KR | 10-2011-0076492 A | 11/2013 |
| WO | 2008/020469 A1 | 2/2008 |

OTHER PUBLICATIONS

Search Report in counterpart Taiwanese Application No. 103118509 dated Sep. 14, 2015, pp. 1.

* cited by examiner

*Primary Examiner* — John S Chu
(74) *Attorney, Agent, or Firm* — Additon, Higgins & Pendleton, P.A.

(57) ABSTRACT

Disclosed are a positive photosensitive resin composition including (A) an alkali soluble resin; (B) a photosensitive diazoquinone compound; (C) a first dissolution-controlling agent including at least one of compounds represented by the following Chemical Formula 1 or Chemical Formula 2; (D) a second dissolution-controlling agent including a compound represented by the following Chemical Formula 3; and (E) a solvent, and a photosensitive resin film and a display device using the same.

13 Claims, No Drawings

POSITIVE PHOTOSENSITIVE RESIN COMPOSITION, AND PHOTOSENSITIVE RESIN FILM AND DISPLAY DEVICE PREPARED BY USING THE SAME

CROSS-REFERENCE TO RELATED APPLICATION

This application claims priority to and the benefit of Korean Patent Application No. 10-2013-0096165 filed in the Korean Intellectual Property Office on Aug. 13, 2013, the entire disclosure of which is incorporated herein by reference.

FIELD OF THE INVENTION

This disclosure relates to a positive photosensitive resin composition and a photosensitive resin film and a display device prepared by using the same.

BACKGROUND OF THE INVENTION

A surface protective layer and an interlayer insulating film for a semiconductor device can use a polyimide resin having excellent heat resistance, electrical characteristics, mechanical characteristics, and the like. The polyimide resin has recently been used as a photosensitive polyimide precursor composition. The photosensitive polyimide precursor composition can be easily coated on a semiconductor device, patterned by ultraviolet (UV) rays, developed, and thermally imidized, to form a surface protective layer, an interlayer insulating film, and the like. Accordingly, the photosensitive polyimide precursor composition may remarkably shorten processing times as compared with a conventional non-photosensitive polyimide precursor composition.

However, the positive photosensitive polyimide precursor composition may not provide the desired pattern, because the carboxylic acid of the polyamic acid is too highly soluble in an alkali. In order to solve this problem, a material having a phenolic hydroxy group instead of carboxylic acid has been suggested (Japanese Patent Laid-open Pyong 10-307393). This material, however, can be insufficiently developed and can cause film loss or result in resin delamination from a substrate.

Recently, another material prepared by mixing the polybenzoxazole precursor with a diazonaphthoquinone compound has drawn attention (Japanese Patent Laid-open Sho 63-96162). However, when actually used as the polybenzoxazole precursor composition, film loss of an unexposed part can be remarkably increased, so that the desirable pattern cannot be obtained after development.

In addition, there is a need for research on a dissolution-controlling agent, since a phenolic compound used to adjust solubility decomposes at a high temperature during thermal curing, causes a side reaction, or the like and, which can result in decreased mechanical properties of a cured film.

SUMMARY OF THE INVENTION

One embodiment of the present invention provides a positive photosensitive resin composition that can have improved contrast between an exposed part and a non-exposed part, and high sensitivity and high resolution.

Another embodiment of the present invention provides a photosensitive resin film formed using the positive photosensitive resin composition.

Yet another embodiment of the present invention provides a display device including the photosensitive resin film.

One embodiment of the present invention provides a positive photosensitive resin composition including (A) an alkali soluble resin; (B) a photosensitive diazoquinone compound; (C) a first dissolution-controlling agent including at least one of compounds represented by the following Chemical Formula 1 or Chemical Formula 2; (D) a second dissolution-controlling agent including a compound represented by the following Chemical Formula 3; and (E) a solvent.

[Chemical Formula 1]

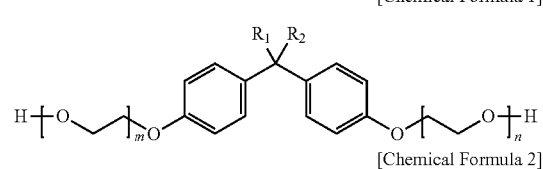

[Chemical Formula 2]

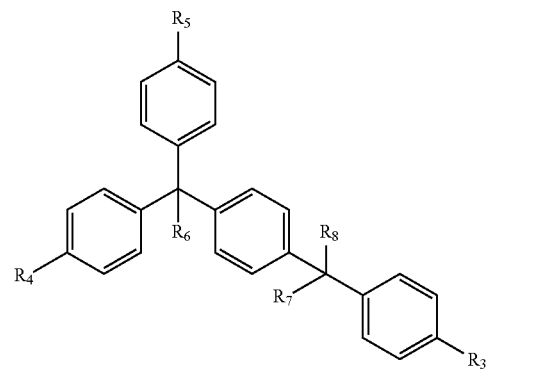

In the above Chemical Formulae 1 and 2, $R_1$ and $R_2$ are the same or different and are each independently hydrogen or substituted or unsubstituted C1 to C30 alkyl, m and n are the same or different and are each independently integers of 1 to 5, and $R_3$ to $R_8$ are the same or different and are each independently hydrogen, a hydroxy group or substituted or unsubstituted C1 to C30 alkyl.

[Chemical Formula 3]

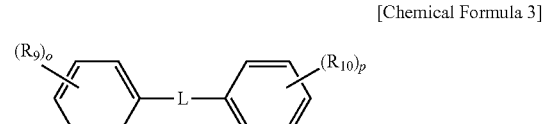

In the above Chemical Formula 3,

L is O, CO, CONH, NH, $S_2$, SO, $SO_2$ or a single bond, $R_9$ and $R_{10}$ are the same or different and are each independently hydrogen, substituted or unsubstituted C1 to C30 alkyl or substituted or unsubstituted C6 to C30 aryl, and o and p are the same or different and are each independently integers of 1 to 5.

The second dissolution-controlling agent may have a boiling point of about 150° C. to about 350° C.

The alkali soluble resin may include a polybenzoxazole precursor, polyimide, or a combination thereof.

The positive photosensitive resin composition may further include a silane coupling agent, a thermal acid generator, or a combination thereof.

The positive photosensitive resin composition may include about 5 parts by weight to about 100 parts by weight of the photosensitive diazoquinone compound (B), about 1 part by weight to about 60 parts by weight of the first dissolution-controlling agent (C), about 1 part by weight to about 20 parts by weight of the second dissolution-controlling agent (D), and about 10 parts by weight to about 900 parts by weight of the solvent (E), each based on about 100 parts by weight of the alkali soluble resin (A).

Another embodiment of the present invention provides a photosensitive resin film formed by using the positive photosensitive resin composition.

Yet another embodiment of the present invention provides a display device including the photosensitive resin film.

Other embodiments of the present invention are included in the following detailed description.

A positive photosensitive resin composition of the present invention provides a photosensitive resin film that can have improved contrast and resolution between an exposed part and a non-exposed part by improving sensitivity of an exposed part and a film residue ratio of a non-exposed part, simultaneously.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with at least one substituent including halogen (—F, —Cl, —Br, or —I), a hydroxy group, a nitro group, a cyano group, an amino group, (NH$_2$, NH(R$_{200}$) or N(R$_{201}$)(R$_{202}$), wherein R$_{200}$, R$_{201}$ and R$_{202}$ are the same or different and are independently C1 to C10 alkyl), an amidino group, a hydrazine group, a hydrazone group, a carboxyl group, substituted or unsubstituted alkyl, substituted or unsubstituted alkenyl, substituted or unsubstituted alkynyl, a substituted or unsubstituted alicyclic organic group, substituted or unsubstituted aryl, a substituted or unsubstituted heterocyclic group, or a combination therein, in place of at least one hydrogen of a functional group.

As used herein, when a specific definition is not otherwise provided, the term "alkyl" refers to C1 to C30 alkyl, for example C1 to C15 alkyl, the term "cycloalkyl" refers to C3 to C30 cycloalkyl, for example C3 to C18 cycloalkyl, the term "alkoxy" refers to C1 to C30 alkoxy, for example C1 to C18 alkoxy, the term "aryl" refers to C6 to C30 aryl, for example C6 to C18 aryl, the term "alkenyl" refers to C2 to C30 alkenyl, for example C2 to C18 alkenyl, the term "alkylene" refers to C1 to C30 alkylene, for example C1 to C18 alkylene, and the term "arylene" refers to C6 to C30 arylene, for example C6 to C16 arylene.

As used herein, when a specific definition is not otherwise provided, the term "aliphatic organic group" refers to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" refers to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" refers to C6 to C30 aryl or C6 to C30 arylene, for example C6 to C16 aryl or C6 to C16 arylene, the term "heterocyclic group" refers to C2 to C30 heterocycloalkyl, C2 to C30 heterocycloalkylene, C2 to C30 heterocycloalkenyl, C2 to C30 heterocycloalkenylene, C2 to C30 heterocycloalkynyl, C2 to C30 heterocycloalkynylene, C2 to C30 heteroaryl, or C2 to C30 heteroarylene that include 1 to 3 hetero atoms including O, S, N, P, Si, or a combination thereof in a ring, for example C2 to C15 heterocycloalkyl, C2 to C15 heterocycloalkylene, C2 to C15 heterocycloalkenyl, C2 to C15 heterocycloalkenylene, C2 to C15 heterocycloalkynyl, C2 to C15 heterocycloalkynylene, C2 to C15 heteroaryl, or C2 to C15 heteroarylene that include 1 to 3 hetero atoms including O, S, N, P, Si, or a combination thereof in a ring.

Also, "*" refers to a linking part between the same or different atoms, or chemical formulae.

A positive photosensitive resin composition according to one embodiment includes (A) an alkali soluble resin, (B) a photosensitive diazoquinone compound, (C) a first dissolution-controlling agent including at least one compound represented by the following Chemical Formula 1 and/or Chemical Formula 2, (D) a second dissolution-controlling agent including a compound represented by the following Chemical Formula 3 and (E) a solvent.

[Chemical Formula 1]

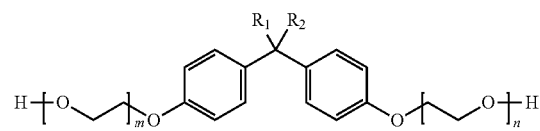

-continued

[Chemical Formula 2]

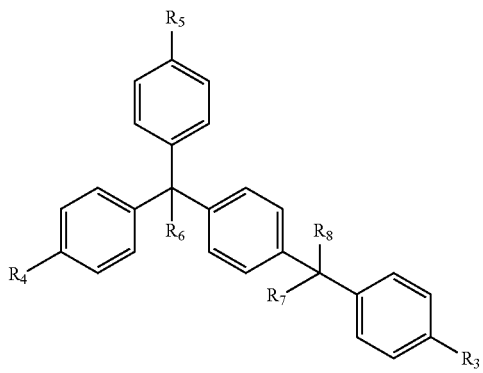

In the above Chemical Formulae 1 and 2, $R_1$ and $R_2$ are the same or different and are each independently hydrogen or substituted or unsubstituted C1 to C30 alkyl, m and n are the same or different and are each independently integers of 1 to 5, and $R_3$ to $R_8$ are the same or different and are each independently hydrogen, a hydroxy group or substituted or unsubstituted C1 to C30 alkyl.

[Chemical Formula 3]

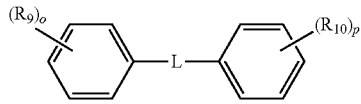

In the above Chemical Formula 3, $R_9$ and $R_{10}$ are the same or different and are each independently hydrogen, substituted or unsubstituted C1 to C30 alkyl, or substituted or unsubstituted C6 to C30 aryl, L is O, CO, CONH, NH, $S_2$, SO, $SO_2$ or a single bond, and o and p are the same or different and are each independently integers of 1 to 5.

The first dissolution-controlling agent can increase the dissolution rate of an exposed part and thus can improve developability of the exposed part, while the second dissolution-controlling agent can suppress dissolution of a non-exposed part and thus can help maintain a film in the non-exposed part, and thus, may optimize contrast and balance between the exposed part and the non-exposed part.

Hereinafter, each component is described in detail.

(C) First Dissolution-Controlling Agent

The first dissolution-controlling agent may include an alkoxylated bisphenol A-type compound represented by the above Chemical Formula 1 and/or a compound represented by the above Chemical Formula 2.

The first dissolution-controlling agent may increase the dissolution rate and sensitivity of the exposed part during development with an alkali aqueous solution and thus may improve developability of the exposed part and may facilitate patterning with a high resolution without a scum.

The positive photosensitive resin composition may include the first dissolution-controlling agent in an amount of about 1 part by weight to about 60 parts by weight, for example, about 20 parts by weight to about 50 parts by weight, based on about 100 parts by weight of the alkali soluble resin (A). In some embodiments, the positive photosensitive resin composition may include the first dissolution-controlling agent in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 parts by weight. Further, according to some embodiments of the present invention, the amount of the first dissolution-controlling agent can be in a range from about any of the foregoing amounts to about any other of the foregoing amounts.

When the first dissolution-controlling agent is used in an amount within the above range, dissolution rate of the exposed part can be appropriately increased, and sensitivity thereof can be improved during development, while film loss of the non-exposed part can be decreased.

(D) Second Dissolution-Controlling Agent

The second dissolution-controlling agent may include the compound represented by the above Chemical Formula 3.

The second dissolution-controlling agent may prevent film loss of the non-exposed part by the first dissolution-controlling agent and thus may improve a contrast between the exposed part and the non-exposed part.

The second dissolution-controlling agent includes a polar element such as oxygen (O), nitrogen (N), sulfur (S), and the like in a part of a molecule and a non-polar element such as carbon (C), hydrogen (H), and the like in another part of the molecule.

In the non-exposed part, the molecular part including the polar element such as oxygen (O), nitrogen (N), sulfur (S), and the like in the compound represented by the above Chemical Formula 3 forms a hydrogen bond with an alkali soluble resin and/or a photosensitive diazoquinone compound and is not exposed to the surface of a film. On the other hand, the molecular part showing non-polarity in the compound represented by the above Chemical Formula 3 does not participate in a hydrogen bond with the alkali soluble resin and/or photosensitive diazoquinone compound but is exposed to the surface of the film. In this way, a part of the second dissolution-controlling agent forms a hydrogen bond with the soluble resin on the surface of the alkali soluble resin film, while the phenyl group part of the second dissolution-controlling agent is arranged on the surface of the film and suppresses the film of the non-exposed part from being dissolved in an alkali developing solution.

On the other hand, the compound represented by the above Chemical Formula 3 reacts with acid generated by a photosensitive diazoquinone compound in the exposed part and is changed into a material having high polarity and thus can be well-dissolved in the alkali developing solution. Accordingly, an alkali soluble resin of the exposed part can be well dissolved in the alkali developing solution. However, the terminal group of the compound represented by the above Chemical Formula 3 is not separated by the above acid.

In this way, the second dissolution-controlling agent may control a non-exposed part to have non-polarity and an exposed part to have polarity and thus can increase a dissolution rate difference between the exposed part and the non-exposed part in a developing solution. Specifically, the second dissolution-controlling agent may decrease a dissolution rate in the non-exposed part but increase a dissolution rate in the exposed part and thus can improve a contrast between the exposed part and the non-exposed part and also, a film residue ratio, pattern-forming capability, sensitivity, and resolution.

In addition, the second dissolution-controlling agent may increase wettability of a photosensitive diazoquinone compound and an alkali soluble resin remaining in the exposed part for a developing solution and thus can effectively remove a scum.

The compound represented by the above Chemical Formula 3 may be, for example, represented by one or more of the following Chemical Formula 3-1 to Chemical Formula 3-3.

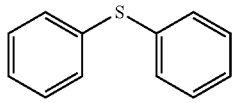

[Chemical Formula 3-1]

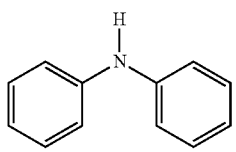

[Chemical Formula 3-2]

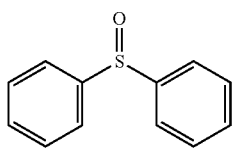

[Chemical Formula 3-3]

The second dissolution-controlling agent may have a boiling point of about 150° C. to about 350° C., for example about 200° C. to about 250° C.

When the second dissolution-controlling agent has a boiling point within the above range, the second dissolution-controlling agent may play a role of maintaining the film of the non-exposed part during the pre-baking but may be volatilized and have no influence on final film characteristics during the post-baking and also, decrease outgas.

The positive photosensitive resin composition may include the second dissolution-controlling agent in an amount of about 1 part by weight to about 20 parts by weight, for example about 3 parts by weight to about 10 parts by weight, based on about 100 parts by weight of the alkali soluble resin (A). In some embodiments, the positive photosensitive resin composition may include the second dissolution-controlling agent in an amount of about 1, 2, 3, 4, 5, 6, 7, 8, 9, 10, 11, 12, 13, 14, 15, 16, 17, 18, 19, or 20 parts by weight. Further, according to some embodiments of the present invention, the amount of the second dissolution-controlling agent can be in a range from about any of the foregoing amounts to about any other of the foregoing amounts.

When the second dissolution-controlling agent is included in an amount within the above range, the non-exposed part may be effectively suppressed from dissolution, while the exposed part may well maintain sensitivity, and a development scum may also be easily removed.

(A) Alkali Soluble Resin

The alkali soluble resin may be a polybenzoxazole precursor, polyimide, or a combination thereof.

The polybenzoxazole precursor may include a repeating unit represented by the following Chemical Formula 5, and the polyimide precursor may include a repeating unit represented by the following Chemical Formula 7.

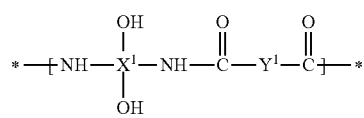

[Chemical Formula 5]

In the above Chemical Formula 5, each $X^1$ is the same or different and each is a substituted or unsubstituted C6 to C30 aromatic organic group, and each $Y^1$ is the same or different and each is a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

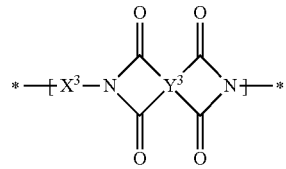

[Chemical Formula 7]

In the above Chemical Formula 7, each $X^3$ is the same or different and each is a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or organic silane group, and each $Y^3$ is the same or different and each is a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group.

In the above Chemical Formula 5, $X^1$ may be an aromatic organic group which is a residual group derived from aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl)hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

Examples of $X^1$ may include without limitation a functional group represented by the following Chemical Formula 8 and/or Chemical Formula 9.

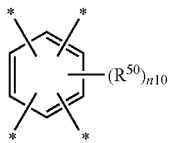

[Chemical Formula 8]

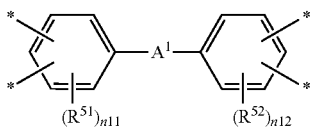

[Chemical Formula 9]

In the above Chemical Formula 8 and Chemical Formula 9,

A1 is a single bond, O, CO, $CR^{47}R^{48}$, $SO_2$, or S, wherein $R^{47}$ and $R^{48}$ are the same or different and are each independently hydrogen or substituted or unsubstituted C1 to C30 alkyl, for example C1 to C30 fluoroalkyl, $R^{50}$ to $R^{52}$ are the same or different and are each independently hydrogen, substituted or unsubstituted C1 to C30 alkyl, a substituted or unsubstituted C1 to C30 carboxyl group, a hydroxy group or a thiol group, n10 is an integer of 0 to 2, and n11 and n12 are the same or different and are each independently integers of 0 to 3.

In the above Chemical Formula 5, $Y^1$ is an aromatic organic group, a divalent to hexavalent aliphatic organic group, or a divalent to hexavalent alicyclic organic group, and may be a residual group of dicarboxylic acid or a residual group of a dicarboxylic acid derivative. In exemplary embodiments, $Y^1$ may be an aromatic organic group or a divalent to hexavalent alicyclic organic group.

Examples of the dicarboxylic acid derivative may include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

Examples of $Y^1$ may include without limitation one or more functional groups represented by the following Chemical Formula 10 to Chemical Formula 12.

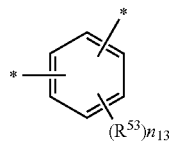

[Chemical Formula 10]

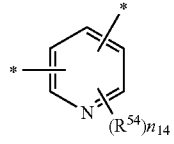

[Chemical Formula 11]

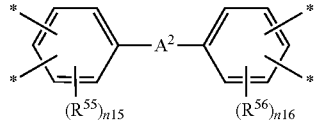

[Chemical Formula 12]

In the above Chemical Formulae 10 to 12, $R^{53}$ to $R^{56}$ are the same or different and are each independently hydrogen or substituted or unsubstituted C1 to C30 alkyl, n13 and n14 are the same or different and are each independently integers of 0 to 4, and n15 and n16 are the same or different and are each independently integers of 0 to 3, and $A^2$ is a single bond, O, $CR^{47}R^{48}$, CO, CONH, S or $SO_2$, wherein $R^{47}$ and $R^{48}$ are the same or different and are each independently hydrogen or substituted or unsubstituted C1 to C30 alkyl, for example C1 to C30 fluoroalkyl.

The polybenzoxazole precursor may have a thermally polymerizable functional group derived from a reactive end-capping monomer, at one terminal end or both terminal ends of the branched chain. Examples of the reactive end-capping monomer may include without limitation monoamines, monoanhydrides, and the like, and combinations thereof having a carbon-carbon double bond.

Examples of the monoamines may include without limitation toluidine, dimethylaniline, ethylaniline, aminophenol, aminobenzylalcohol, aminoindan, aminoacetonephenone, and the like, and combinations thereof.

In the above Chemical Formula 7, $X^3$ is an aromatic organic group, a divalent to hexavalent aliphatic organic group, a divalent to hexavalent alicyclic organic group. In exemplary embodiments, $X^3$ may be an aromatic organic group or a divalent to hexavalent alicyclic organic group.

Specifically $X^3$ may be a residual group derived from aromatic diamine, alicyclic diamine, or silicon diamine. The aromatic diamine, alicyclic diamine, and silicon diamine may be used singularly or as a mixture of one or more.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis[4-(4-aminophenoxyl)phenyl]sulfone, bis(3-aminophenoxyphenyl)sulfone, bis(4-aminophenoxy)biphenyl, bis[4-(4-aminophenoxyl)phenyl]ether, 1,4-bis(4-aminophenoxy)benzene, the foregoing compounds including an aromatic ring substituted with an alkyl group or a halogen, and the like, and combinations thereof.

Examples of the alicyclic diamine may include without limitation 1,2-cyclohexyl diamine, 1,3-cyclohexyl diamine, and the like, and combinations thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

In the above Chemical Formula 7, $Y^3$ is an aromatic organic group, a tetravalent to hexavalent aliphatic organic group, or a tetravalent to hexavalent alicyclic organic group. In exemplary embodiments, $Y^3$ may be an aromatic organic group or a tetravalent to hexavalent alicyclic organic group.

$Y^3$ may be a residual group derived aromatic acid dianhydride or alicyclic acid dianhydride. The aromatic acid dianhydride and the alicyclic acid dianhydride may be used singularly or as a mixture of more than one.

Examples of the aromatic acid dianhydride may include without limitation pyromellitic dianhydride; benzophenone tetracarboxylic dianhydride such as benzophenone-3,3',4,4'-tetracarboxylic dianhydride; oxydiphthalic dianhydride such as oxydiphthalic acid dianhydride; biphthalic dianhydride such as 3,3',4,4'-biphthalic dianhydride; hexafluoroisopropyledene)diphthalic dianhydride such as 4,4'-(hexafluoroisopropyledene)diphthalic dianhydride; naphthalene-1,4,5,8-tetracarboxylic dianhydride; 3,4,9,10-perylenetetracarboxylic dianhydride, and the like, and combinations thereof.

Examples of the alicyclic acid dianhydride may include without limitation 1,2,3,4-cyclobutanetetracarboxylic dianhydride, 1,2,3,4-cyclopentanetetracarboxylic dianhydride, 5-(2,5-dioxotetrahydrofuryl)-3-methyl-cyclohexane-1,2-dicarboxylic anhydride, 4-(2,5-dioxotetrahydrofuran-3-yl)-tetralin-1,2-dicarboxylic anhydride, bicyclooctene-2,3,5,6-tetracarboxylic dianhydride, bicyclooctene-1,2,4,5-tetracarboxylic dianhydride, and the like, and combinations thereof.

The alkali soluble resin may have a weight average molecular weight (Mw) of about 3,000 to about 300,000 g/mol, for example about 5,000 to about 30,000 g/mol. When the alkali soluble resin has a weight average molecular weight (Mw) within the above range, there may be sufficient film residue ratios at non-exposed parts during development using an alkali aqueous solution, and patterning may be performed efficiently.

(B) Photosensitive Diazoquinone Compound

The photosensitive diazoquinone compound may be a compound having a 1,2-benzoquinone diazide structure and/or a 1,2-naphthoquinone diazide structure.

The photosensitive diazoquinone compound may include at least one or more compounds represented by the following Chemical Formulae 13 and 15 to 17, but is not limited thereto.

[Chemical Formula 13]

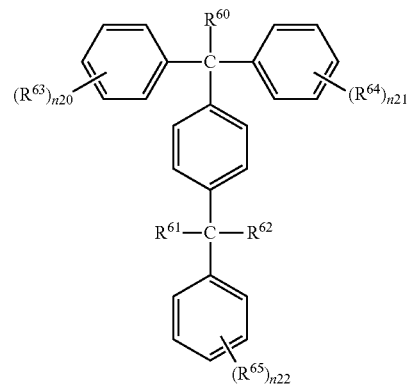

In the above Chemical Formula 13, $R^{60}$ to $R^{62}$ are the same or different and are each independently hydrogen or substituted or unsubstituted C1 to C30 alkyl, for example methyl, $R^{63}$ to $R^{65}$ are the same or different and are each independently OQ, where the Q is hydrogen, a functional group represented by the following Chemical Formula 14a, or a functional group represented by the following Chemical Formula 14b, provided that all of the Qs are not simultaneously hydrogen, and n20 to n22 are the same or different and are each independently integers of 0 to 5.

[Chemical Formula 14a]

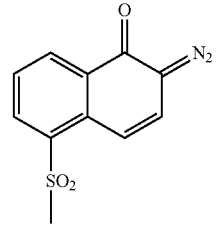

[Chemical Formula 14b]

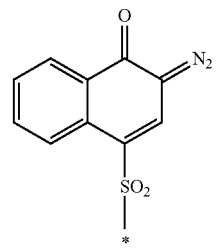

13

-continued

[Chemical Formula 15]

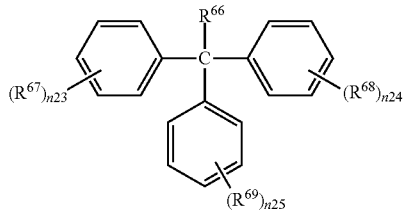

In the above Chemical Formula 15, $R^{66}$ may be hydrogen or substituted or unsubstituted C1 to C30 alkyl, $R^{67}$ to $R^{69}$ are the same or different and are each independently OQ, where the Q is the same as defined in the above Chemical Formula 13, and n23 to n25 are the same or different and are each independently integers of 0 to 5.

[Chemical Formula 16]

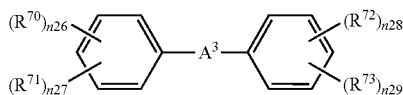

In the above Chemical Formula 16, $A^3$ may be CO or $CR^{74}R^{75}$, wherein the $R^{74}$ and $R^{75}$ are the same or different and are each independently substituted or unsubstituted C1 to C30 alkyl, $R^{70}$ to $R^{73}$ are the same or different and are each independently hydrogen, substituted or unsubstituted C1 to C30 alkyl, OQ or NHQ, wherein the Q is the same as defined in the above Chemical Formula 13, n26 to n29 are the same or different and are each independently integers of 0 to 4, n26+n27 and n28+n29 are the same or different and are each independently integers of less than or equal to 5.

At least one of the $R^{70}$ to $R^{73}$ may be OQ, and one aromatic ring includes one to three OQs and the other aromatic ring includes one to four OQs.

[Chemical Formula 17]

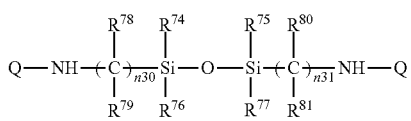

In the above Chemical Formula 17, $R^{74}$ to $R^{81}$ are the same or different and are each independently hydrogen or substituted or unsubstituted C1 to C30 alkyl, n30 and n31 are the same or different and are each independently integers of 1 to 5, and Q is the same as defined in the above Chemical Formula 13.

The positive photosensitive resin composition may include the photosensitive diazoquinone compound in an amount of about 5 to about 100 parts by weight, for example about 10 to about 50 parts, by weight based on about 100 parts by weight of the alkali soluble resin (A). In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the photosensitive diazoquinone compound is present in an amount within the above range, the pattern can be well-formed with minimal or no residue from exposure, and film thickness loss during development may be prevented and thereby a good pattern can be provided.

(E) Solvent

The positive photosensitive resin composition may include a solvent that is capable of easily dissolving each component.

Examples of the solvent may include without limitation alkylene glycol alkylethers such as ethylene glycol monomethylether, ethylene glycol monoethylether, propylene glycol monomethylether, propylene glycol monoethylether, diethylene glycoldimethylether, diethylene glycoldiethylether, diethylene glycoldibutylether, propylene glycolmonomethylether, dipropylene glycolmonomethylether, 1,3-butylene glycol-3-monomethylether, and the like, alkylacetates such as propylacetate, butylacetate, isobutylacetate, and the like, ketones such as acetylacetone, methylpropylketone, methylbutylketone, methylisobutylketone, cyclopentanone and the like, alcohols such as butanol, isobutanol, pentenol, 4-methyl-2-pentenol, and the like, aromatic hydrocarbons such as toluene, xylene, and the like, N-methyl-2-pyrrolidone, N-cyclohexyl-2-pyrrolidone, N,N-dimethylformamide, γ-butyrolactone, N,N-dimethylacetamide, dimethylsulfoxide, propylene glycolmonomethyl ether acetate, methyl lactate, ethyl lactate, butyl lactate, methyl-1,3-butylene glycol acetate, 3-methyl-3-methoxybutylacetate, methyl pyruvate, ethyl pyruvate, methyl-3-methoxy propionate, and the like, and combinations thereof. The solvent may be used singularly or as a mixture of two or more.

The solvent may be selected appropriately depending on a process of forming a photosensitive resin film such as spin coating, slit die coating, and the like.

The positive photosensitive resin composition may include the solvent in an amount of about 10 parts by weight to about 900 parts by weight, for example about 10 parts by weight to about 400 parts by weight, based on about 100 parts by weight of the alkali soluble resin (A).

When the positive photosensitive resin composition includes the solvent in an amount within the above range, a sufficiently thick film may be obtained, and good solubility and coating properties may be provided.

(F) Other Additives

The positive photosensitive resin composition according to one embodiment may further include one or more other additives.

The other additive may include a silane coupling agent, a thermal acid generator, or a combination thereof.

The silane coupling agent may be, for example, a silane compound having a carbon-carbon unsaturated bond, but is not limited thereto.

Examples of the silane compound having a carbon-carbon unsaturated bond may include without limitation vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane, trimethoxy[3-(phenylamino)propyl]silane, and the like, and combinations thereof.

The silane coupling agent may be used in an amount of about 0.01 parts by weight to about 1 part by weight based on about 100 parts by weight of the alkali soluble resin. When the silane-based compound is used in an amount within the above range, adherence to a metal substrate may be improved, a residue film after development may not remain, and light characteristics and mechanical properties such as tensile strength, an extension rate, and the like may be improved.

Examples of the thermal acid generator may include without limitation arylsulfonic acids such as p-toluenesulfonic acid, benzenesulfonic acid, and the like; perfluoroalkylsulfonic acids such as trifluoromethanesulfonic acid, trifluorobutanesulfonic acid, and the like; alkylsulfonic acids such as methanesulfonic acid, ethanesulfonic acid, butanesulfonic acid, and the like; and the like, and combinations thereof.

The thermal acid generator is a catalyst for a dehydration reaction and a cyclization reaction of polyamide including a phenolic hydroxy group of the polybenzoxazole precursor, and thus a cyclization reaction may be performed smoothly even if a curing temperature is decreased to about 300° C.

In addition, an additive such as a suitable surfactant and/or leveling agent may be included in order to prevent a stain of the film and/or to improve the development.

The formation process of a pattern by using the positive photosensitive resin composition may include coating the positive photosensitive resin composition on a support substrate in a method of spin-coating, slit coating, inkjet printing, and the like; drying the coated positive photosensitive resin composition to form a positive photosensitive resin composition film; exposing the positive photosensitive resin composition film to light; developing the exposed positive photosensitive resin composition film with an alkali aqueous solution to form a photosensitive resin film; and heat-treating the photosensitive resin film. The formation process of a pattern is performed under conditions well-known in a related art and will not be illustrated in detail herein.

According to another embodiment, a photosensitive resin film prepared using the positive photosensitive resin composition is provided.

The photosensitive resin film may have sensitivity ranging from about 70 mJ/cm$^2$ to about 90 mJ/cm$^2$. Herein, sensitivity of the photosensitive resin film is improved, and thus, yield and time thereof may be reduced.

According to one embodiment, a display device including the photosensitive resin film is provided.

Hereinafter, the present invention is illustrated in more detail with reference to the following examples and comparative examples. However, the following examples and comparative examples are provided for the purpose of descriptions and the present invention is not limited thereto.

Preparation Example 1

Preparation of Alkali Soluble Resin 41.1 g of 2,6-bis[[[5-[1-(amino-4-hydroxyphenyl)-2,2,2-trifluoro-1-(trifluoromethyl)ethyl]-2-hydroxyphenyl]amino]methyl]-4-methylphenol is dissolved in 280 g of N-methyl-2-pyrrolidone (NMP) in a 4-necked flask having an agitator, a temperature controller, a nitrogen gas injector, and a cooler, while nitrogen is passing through the flask. When the solid is completely dissolved, 9.9 g of pyridine is added to the solution, and another solution obtained by dissolving 13.3 g of 4,4'-oxydibenzonyl chloride in 142 g of N-methyl-2-pyrrolidone (NMP) is slowly added to the mixture in a dropwise fashion for 30 minutes while the mixture is maintained at a temperature of 0° C. to 5° C. The obtained mixture is reacted for 1 hour at 0° C. to 5° C. and then, heated up to room temperature and agitated for one hour to complete the reaction.

Subsequently, 1.6 g of 5-norbornene-2,3-dicarboxyanhydride is added thereto, and the mixture is agitated at 70° C. for 24 hours to complete the reaction. The reaction mixture is put in a solution of water/methanol=10/1 (a volume ratio) to produce a precipitate, the precipitate is filtered and washed with water, and dried at 80° C. under vacuum for greater than or equal to 24 hours, manufacturing a polybenzoxazole precursor having a weight average molecular weight of 9,500 g/mol and represented by the following Chemical Formula A.

[Chemical Formula A]

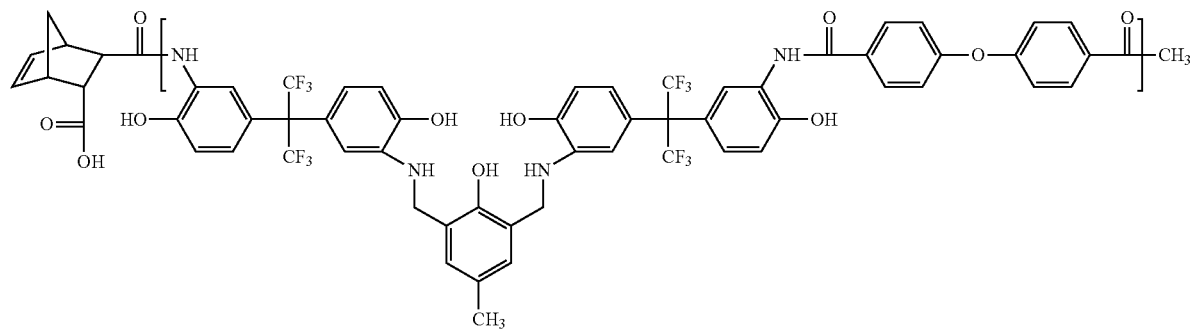

Example

Preparation of Positive Photosensitive Resin Composition

Components used to manufacture a positive photosensitive resin composition are provided as follows.

(A) Alkali Soluble Resin

A compound represented by the above Chemical Formula A according to Preparation Example 1 is used.

(B) Photosensitive Diazoquinone Compound

A compound represented by the following Chemical Formula B is used.

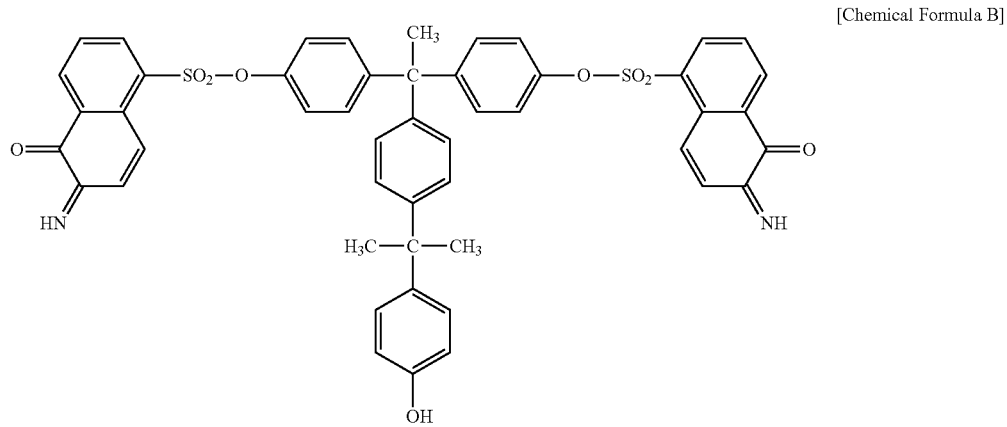

[Chemical Formula B]

(C) First Dissolution-Controlling Agent (C-1) 2-[4-[2-[4-(2-hydroxyethoxy)phenyl]propane-2-yl]phenoxy]ethanol represented by the following Chemical Formula C-1 is used.

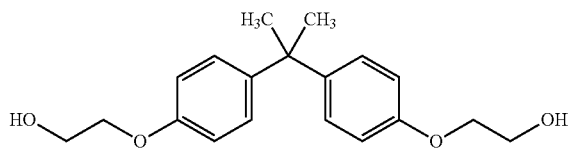

[Chemical Formula C-1]

(C-2) TPPA (α,α,α-tris(4-hydroxyphenyl)-1-ethyl-4-isopropyl benzene) represented by the following Chemical Formula C-2 is used.

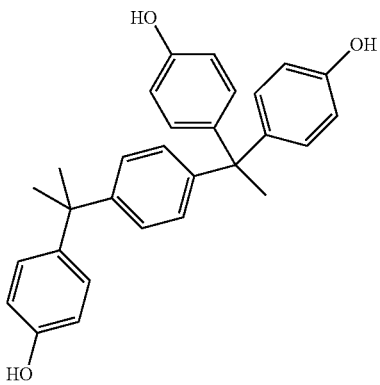

[Chemical Formula C-2]

(D) Second Dissolution-Controlling Agent

A compound represented by Chemical Formula 3-1 (D-1) and A compound represented by Chemical Formula 3-3 (D-2) are used.

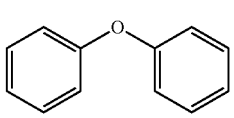

[Chemical Formula 3-1]

-continued

[Chemical Formula 3-3]

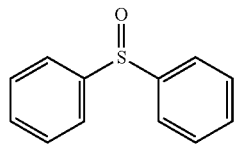

(E) Solvent
(E-1) propylene glycolmonomethylether (PGME) is used.
(E-2) Ethyl lactate (EL) is used.
(E-3) γ-butyrolactone (GBL) is used.
(F) Additive
Trimethoxy[3-(phenylamino)propyl]silane represented by the following Chemical Formula F is used as a silane coupling agent.

[Chemical Formula F]

Examples 1 to 9 and Comparative Examples 1 to 5

The positive photosensitive resin compositions according to Examples 1 to 9 and Comparative Examples 1 to 5 are preparing using the types and amounts of components shown in the following Table 1. Specifically, the positive photosensitive resin compositions are obtained by dissolving an alkali soluble resin in a solvent, adding a photosensitive diazoquinone compound, an additive (a silane coupling agent), a first dissolution-controlling agent, and a second dissolution-controlling agent thereto, agitating and stabilizing the mixture at room temperature for 3 hours, and filtering the resultant with a 0.45 μm fluororesin filter. In the following Table 1, the units of the amounts of each component (B), (C), (D), (E), and (F) is parts by weight based on 100 parts by weight of the alkali soluble resin (A).

Evaluation: Film Residue Ratio, Sensitivity, and Contrast
(1) Formation of Film and Pattern The photosensitive resin compositions according to Examples 1 to 9 and Comparative Examples 1 to 5 are respectively spin-coated on an ITO glass and heated on a hot plate at 120° C. for 100 seconds, forming each photosensitive polybenzoxazole precursor film. Subsequently, the polybenzoxazole precursor films are exposed by using I-line stepper (NSR i10C, Nikon Corp.) after a mask having various-sized patterns is put thereon and then, washed with pure water for 30 seconds after dissolving and removing the exposed part in a 2.38% tetramethylammonium hydroxide (TMAH) aqueous solution for 40 seconds at room temperature through 2 puddles. Subsequently, the obtained pattern is cured in an oxygen concentration of less than or equal to 1000 ppm at 250° C. for 40 minutes under an $N_2$ atmosphere by using an electric furnace.

(2) Film Residue Ratio

The prebaked film is developed in a 2.38% tetramethylammonium hydroxide (TMAH) aqueous solution at 23.5° C. for 60 seconds, washed with ultra-pure water for 60 seconds, and then, thickness change of the film is measured by using Alpha Step (Tencor Corp.), film residue ratio of the film is calculated according to the following equation 1, and the result is provided in the following Table 2.

Film residue ratio (%)=(Film thickness after development/Film thickness before development)× 100 [Equation 1]

(3) Sensitivity

Sensitivity is measured by using an I-line light source, and the results are provided in the following Table 2. After the exposure and development, exposure time taken to form a 10 μm L/S pattern to be a 1:1 line width is measured and regarded as maximum exposure time. The resolution is measured based a minimum pattern dimension in the maximum exposure time. Specifically, a target CD (critical dimension) exposure dose is calculated by using a 10 μm target as a CD (critical dimension) size and measuring the CD size after exposing and developing the film with each exposure dose of 120 mJ/sec, 140 mJ/sec, and 160 mJ/sec.

TABLE 1

| | | Comparative Examples | | | | | Examples | | | | | | | | |
|---|---|---|---|---|---|---|---|---|---|---|---|---|---|---|---|
| | | 1 | 2 | 3 | 4 | 5 | 1 | 2 | 3 | 4 | 5 | 6 | 7 | 8 | 9 |
| (A) Alkali soluble resin | | 100 | 100 | 100 | 100 | 100 | 100 | 100 | 100 | 100 | 100 | 100 | 100 | 100 | 100 |
| (B) Photosensitive diazoquinone compound | | 40 | 40 | 40 | 40 | 40 | 40 | 40 | 40 | 40 | 40 | 40 | 40 | 40 | 40 |
| (C) First dissolution-controlling agent | (C-1) | 20 | 0 | 40 | 0 | 0 | 40 | 40 | 40 | 0 | 0 | 0 | 30 | 50 | 50 |
| | (C-2) | 0 | 20 | 0 | 40 | 0 | 0 | 0 | 0 | 40 | 40 | 40 | 0 | 0 | 0 |
| (D) Second dissolution-controlling agent | (D-1) | 0 | 0 | 0 | 0 | 8 | 3 | 5 | 8 | 3 | 5 | 8 | 8 | 8 | 0 |
| | (D-2) | 0 | 0 | 0 | 0 | 0 | 0 | 0 | 0 | 0 | 0 | 0 | 0 | 0 | 8 |
| (E) Solvent | (E-1) | 180 | 180 | 180 | 180 | 180 | 180 | 180 | 180 | 180 | 180 | 180 | 180 | 180 | 180 |
| | (E-2) | 60 | 60 | 60 | 60 | 60 | 60 | 60 | 60 | 60 | 60 | 60 | 60 | 60 | 60 |
| | (E-3) | 30 | 30 | 30 | 30 | 30 | 30 | 30 | 30 | 30 | 30 | 30 | 30 | 30 | 30 |
| (F) Additive | | 0.02 | 0.02 | 0.02 | 0.02 | 0.02 | 0.02 | 0.02 | 0.02 | 0.02 | 0.02 | 0.02 | 0.02 | 0.02 | 0.02 |

(4) Dissolution Rate (DR)

The photosensitive resin compositions are respectively spin-coated to have the same thickness (4 μm) on an 8 inch-thick silicon wafer and then, soft-baked at 120° C. for 100 seconds. Average dissolution rates of these coated wafers are measured with a resist development system (RDA-760 system, Litho Tech Japan Corp), and the results are provided in the following Table 2. Herein, 2.38% tetramethylammonium hydroxide (TAMH) is used as a developing solution, and the developing solution and a developing zone are maintained at 23.5° C. Each sample is three times repeated, and the obtained measurements are averaged.

(5) Contrast

Contrast is calculated as a ratio between the DR of an exposed part and the DR of a non-exposed part measured in the following equation 2, that is, the 4, and the results are provided in the following Table 2.

$$\text{Contrast} = \text{DR of an exposed part} / \text{DR of a non-exposed part} \quad \text{[Equation 2]}$$

TABLE 2

| | Comparative Examples | | | | | Examples | | | | | | | | |
|---|---|---|---|---|---|---|---|---|---|---|---|---|---|---|
| | 1 | 2 | 3 | 4 | 5 | 1 | 2 | 3 | 4 | 5 | 6 | 7 | 8 | 9 |
| Film residue ratio after development (%) | 75 | 80 | 50 | 55 | 95 | 60 | 71 | 82 | 63 | 74 | 85 | 85 | 80 | 77 |
| Sensitivity (mJ/cm$^2$) | 100 | 115 | 60 | 75 | 250 | 78 | 79 | 79 | 80 | 80 | 81 | 90 | 68 | 75 |
| DR of exposed part (Å/mJ) | 577 | 462 | 885 | 769 | — | 640 | 643 | 670 | 610 | 613 | 640 | 600 | 770 | 680 |
| DR of non-exposed part (Å/s) | 116 | 97 | 217 | 198 | — | 100 | 105 | 107 | 103 | 106 | 109 | 104 | 110 | 105 |
| Contrast | 5.0 | 4.8 | 4.1 | 3.9 | — | 6.4 | 6.1 | 6.3 | 5.9 | 5.8 | 5.9 | 5.8 | 7.0 | 6.5 |

Referring to Table 2, when the compositions according to Comparative Examples 1, 2, 3, and 4 include more first dissolution-controlling agent, sensitivity is more improved, but film residue ratio is deteriorated after development. In addition, since each dissolution rate (DR) between an exposed part and a non-exposed part increases in proportion to the amount of the first dissolution-controlling agent, contrast between the exposed part and the non-exposed part decreases.

In addition, Comparative Example 5 using no first dissolution-controlling agent improving a dissolution rate exhibits a very high film residue ratio of 95% after the development but deteriorated sensitivity down to 250 mJ/cm$^2$ and thus, may not be appropriately used.

In contrast, Examples 1 to 9 including both the first dissolution-controlling agent and the second dissolution-controlling agent exhibit excellent sensitivity and also a good film residue ratio. In addition, Examples 1 to 9 exhibit good film residue ratios as well as excellent sensitivity and thus, exhibit an increased contrast between the exposed part and the non-exposed part.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A positive photosensitive resin composition, comprising:

(A) an alkali soluble resin;

(B) a photosensitive diazoquinone compound;

(C) a first dissolution-controlling agent including at least one of compounds represented by the following Chemical Formula 1 or Chemical Formula 2;

(D) a second dissolution-controlling agent including a compound represented by the following Chemical Formula 3; and (E) a solvent:

[Chemical Formula 1]

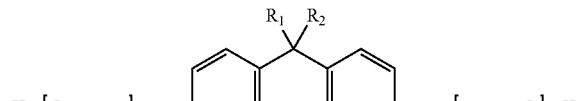

[Chemical Formula 2]

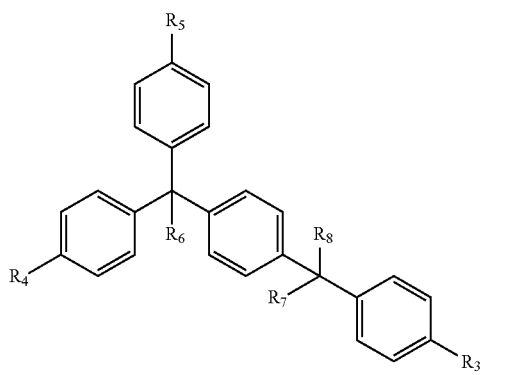

wherein, in the above Chemical Formulae 1 and 2, $R_1$ and $R_2$ are the same or different and are each independently hydrogen or substituted or unsubstituted C1 to C30 alkyl, m and n are the same or different and are each integers of 1 to 5, and $R_3$ to $R_8$ are the same or different and are each independently hydrogen, a hydroxy group or substituted or unsubstituted C1 to C30 alkyl,

[Chemical Formula 3]

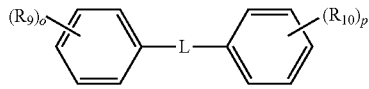

wherein, in the above Chemical Formula 3,

L is O, CO, CONH, $S_2$, SO, or $SO_2$, $R_9$ and $R_{10}$ are the same or different and are each independently hydrogen, substituted or unsubstituted C1 to C30 alkyl or substituted or unsubstituted C6 to C30 aryl, and o and p are the same or different and are each independently integers of 1 to 5.

2. The positive photosensitive resin composition of claim 1, wherein the second dissolution-controlling agent has a boiling point of about 150° C. to about 350° C.

3. The positive photosensitive resin composition of claim 1, wherein the alkali soluble resin is a polybenzoxazole precursor, polyimide, or a combination thereof.

4. The positive photosensitive resin composition of claim 1, wherein the positive photosensitive resin composition further comprises a silane coupling agent, a thermal acid generator, or a combination thereof.

5. The positive photosensitive resin composition of claim 1, wherein the positive photosensitive resin composition comprises:

about 5 parts by weight to about 100 parts by weight of the photosensitive diazoquinone compound (B), about 1 part by weight to about 60 parts by weight of the first dissolution-controlling agent (C), about 1 part by weight to about 20 parts by weight of the second dissolution-controlling agent (D), and about 10 parts by weight to about 900 parts by weight of the solvent (E), each based on about 100 parts by weight of the alkali soluble resin (A).

6. A photosensitive resin film formed by using the positive photosensitive resin composition of claim 1.

7. A display device comprising the photosensitive resin film of claim 6.

8. The positive photosensitive resin composition of claim 1, wherein L in Chemical Formula 3 is O.

9. The positive photosensitive resin composition of claim 1, wherein L in Chemical Formula 3 is CO.

10. The positive photosensitive resin composition of claim 1, wherein L in Chemical Formula 3 is CONH.

11. The positive photosensitive resin composition of claim 1, wherein L in Chemical Formula 3 is $S_2$.

12. The positive photosensitive resin composition of claim 1, wherein L in Chemical Formula 3 is SO.

13. The positive photosensitive resin composition of claim 1, wherein L in Chemical Formula 3 is $SO_2$.

* * * * *